(12) United States Patent
Ananth (10) Patent No.: US 7,317,356 B2
(45) Date of Patent: Jan. 8, 2008

(54) ULTRA LOW-FREQUENCY RESPONSE, DC-BLOCKED LOW-NOISE AMPLIFIER

(75) Inventor: Ravi S. Ananth, Castaic, CA (US)

(73) Assignee: Alfred E. Mann Foundation for Scientific Research, Santa Clarita, CA (US)

( * ) Notice: Subject to any disclaimer, the term of this patent is extended or adjusted under 35 U.S.C. 154(b) by 108 days.

(21) Appl. No.: 11/173,507

(22) Filed: Jul. 1, 2005

(65) Prior Publication Data

US 2006/0197597 A1 Sep. 7, 2006

Related U.S. Application Data

(60) Provisional application No. 60/658,244, filed on Mar. 2, 2005.

(51) Int. Cl.
*H03F 3/45* (2006.01)
(52) U.S. Cl. ...................................... 330/253
(58) Field of Classification Search ..................... None
See application file for complete search history.

(56) References Cited

U.S. PATENT DOCUMENTS

| 4,647,865 A | | 3/1987 | Westwick et al. | |
|---|---|---|---|---|
| 5,406,223 A | * | 4/1995 | Vulih et al. | 330/258 |
| 5,479,045 A | | 12/1995 | Narahara et al. | |
| 5,767,542 A | * | 6/1998 | Nakamura | 257/296 |
| 5,838,199 A | * | 11/1998 | Nakamura | 330/258 |
| 6,331,803 B1 | * | 12/2001 | Zheng et al. | 330/254 |
| 6,590,805 B2 | * | 7/2003 | Lu et al. | 365/158 |
| 6,750,704 B1 | * | 6/2004 | Connell et al. | 330/9 |
| 2004/0066233 A1 | | 4/2004 | Miyagi | |
| 2004/0141562 A1 | | 7/2004 | Plisch et al. | |

FOREIGN PATENT DOCUMENTS

EP 0 101 338 A2 2/1984

* cited by examiner

*Primary Examiner*—Robert Pascal
*Assistant Examiner*—Alan Wong
(74) *Attorney, Agent, or Firm*—Malcolm J. Romano (57) ABSTRACT

An amplifier circuit is disclosed that allows for practical integrated circuit implementation of a dc-blocked, low-noise differential amplifier capable of amplifying ultra low-frequency signals and amplitudes ranging upwards of a few microvolts. DC-blocking capacitors having a capacitance value close to that of the effective input capacitance of the low-noise amplifier's inputs can be used by incorporating a positive feedback mechanism that tracks any variations in the amplifier gain or integrated circuit's technology process and lowers or cancels the input parasitic capacitances. Advantageously, the parasitic capacitance of transistors, typically field effect transistors, located on an integrated circuit chip are used in the feedback mechanism. This reduces the capacitive voltage division loss of the signal at the input of the amplifier while still allowing for the use of very small values of dc-blocking capacitance. No other active elements other than the amplifier itself are required to attain a low area, integrated circuit implementation of a dc-blocked, yet ultra low-frequency high pass filtered, low-noise amplifier.

15 Claims, 5 Drawing Sheets

ULTRA LOW-FREQUENCY RESPONSE, DC-BLOCKED LOW-NOISE AMPLIFIER

RELATED APPLICATION(S)

The present application claims the benefit under 35 USC 119(e) to Provisional Patent Application U.S. Ser. No. 60/658,244, filed Mar. 2, 2005 and entitled "ULTRA LOW-FREQUENCY, DC BLOCKED LOW-NOISE AMPLIFIER FOR BIO-POTENTIAL SENSING".

BACKGROUND OF THE INVENTION

This invention relates generally to amplifiers used to measure low level signals and, more particularly, to low-noise amplifiers used to measure ultra low-frequency signals where direct current (dc) blocking between the signal source and input to the low-noise amplifier is required. Typically, such requirement arises when large dc voltages are present at the signal source.

Low-noise amplifiers, which are also referred to as "LNAs", are a common and useful building block in electronic circuits where one of the design goals is the selective amplification of very small analog signals that are present within a noisy common mode signal typically created by power line (60 Hz noise), and where both the signal and common mode noise occupy the same frequency band of operation.

Design specifications that require the detection of very low-frequency signals with large DC offsets are typically satisfied by using very large valued capacitors and resistors between the signal source and the LNA to achieve the desired circuit response characteristics. Large valued capacitors and resistors can severely hamper the integrated circuit implementation of a LNA due to the large integrated circuit (IC) micro chip or die area and geometry dedicated to creating such capacitors and resistors.

As is understood, bio-potential signals such as electromyograms, electroneurograms and low-field potentials from cortical activity have an extremely low-frequency content in their signals. Typical frequency ranges are 0.5 Hz to 1 kHz. The requirement for dc-blocking of leakage currents to protect tissue or to block high-voltage (12 to 14V) stimulation voltages that may reside on the same sensing terminals, requires that the sensing amplifier be ac-coupled to the sensing terminals. When ac-coupling is required in an integrated circuit implementation, typical implementations result in the waste of large die area due to the requirement of extremely large capacitors and resistors that form a high-pass filter function. Bio-signal levels of under 10 uVrms discourage the use of active filter implementation, as the noise contributions would be too large. An embodiment of the present invention discloses a novel and simple method to achieve dc-blocked, ultra low-frequency (ULF) low-noise amplifier (LNA) structure. The implementation achieves high-pass filter corners of under 20 mHz (millli-Hertz) with die areas that are 50 times smaller than conventional approaches. The approach disclosed uses passive capacitive components that further ensure that the low-noise characteristics are maintained or even improved over state-of-the-art approaches. Each of the signals identified possesses quite different amplitude and frequency characteristics as shown in Table 1.

TABLE 1

Biosignal Types And Corresponding Electrical Traits

| Signal Type | Amplitude Range | Frequency Range |
|---|---|---|
| Electromyogram (EMG) | 10 μV-10 mV | 10 Hz-3 kHz |
| Neural potentials | 10 μV-500 μV | 100 Hz-5 kHz |
| Low field potentials (LFPs) | 100 μV-1 mV | 0.5 Hz-50 Hz |

Furthermore, the presence of low-frequency signals typically necessitates the use of input devices that consume large IC die areas in order to lower the "1/f" noise of the LNA. Several "1/f" noise reduction techniques are known in the art. While these techniques are beneficial in reducing low-frequency noise and circuit IC die area, they are less practical when the size and power constraints are especially stringent and when a dc-blocking capacitor is required in the circuit design.

BRIEF SUMMARY OF THE INVENTION

Briefly stated, the present disclosure is related to a dc-blocked, differential input/output LNA circuit. The circuit includes an amplifier that has a positive input, a negative input, a positive output, and a negative output. The amplifier includes a first transistor providing a first input capacitor at the positive input and a second input transistor providing a second input capacitor at the negative input. Additionally, the amplifier includes a third capacitor coupled between the positive output and the positive input and a fourth capacitor coupled between the negative output and the negative input. Importantly, the third capacitor has a capacitance value that is a pre-determined percentage of the capacitance value of the first input capacitor and the fourth capacitor has a capacitance value that is a pre-determined percentage of the capacitance value of the second input capacitor.

Advantage is made of the first input transistor in that the first input capacitor comprises the parasitic capacitance of said first input transistor. Similarly, the second input capacitor comprises the parasitic capacitance of said second input transistor. In a similar fashion, a third transistor is coupled between the positive output and positive input providing the third capacitor which comprises the parasitic capacitance of the third transistor and a fourth transistor coupled between the negative output and negative input providing the fourth capacitor which comprises the parasitic capacitance of the fourth transistor.

Advantageously, the first and second input transistors and third and fourth transistors are field effect transistors (FET).

The primary contributors to the parasitic capacitance of a FET are the gate-to-source capacitance, $C_{gs}$, and the gate-to-drain capacitance, $C_{gd}$. The effective capacitance looking into the amplifier inputs will be dominated by the gate-to-drain capacitance, $C_{gd}$, of the FET at the amplifier's input, since by reason of the Miller Effect, $C_{gd}$ will be multiplied by the open loop gain, $A_o$, of the amplifier.

The values of the dc-blocking capacitors used for each amplifier input are selected based on the values of the capacitors at each of the amplifier's inputs, and the dc-blocking capacitors are specified to be at least as large as the input capacitors, but since the input capacitors are relatively small, the IC die area required for the dc-blocking capacitors will still be orders of magnitude less than the IC die area required in more conventional dc-blocked LNA applications. Since the input impedance of the amplifier input FETs is extremely high, an ultra low-frequency high pass corner can be achieved with the amplifier according to the invention regardless of the magnitude of the dc-blocking capacitor.

A voltage divider effect on the input signals to the amplifier, however, will result from the dc-blocking capacitors being in series with the input capacitors. In the amplifier of the present invention, this voltage divider effect can be controlled by using positive feedback between each amplifier output and input, such that a capacitor having a value approximating that of the parasitic gate-to-drain capacitance, $C_{gd}$, of the amplifier input FETs will tend to cancel the input capacitance and therefore increase the signals at the amplifier inputs by an amount almost equal to the amount the signals are attenuated by the voltage divider effect. The positive feedback capacitance will, like the gate-to-drain capacitance, $C_{gd}$, be multiplied by the open loop gain, $A_o$, of the amplifier. Under some circumstances, it may be desirable to vary the positive feedback capacitance so as to control or otherwise program the degree of signal attenuation at the amplifier inputs, depending on the application for the LNA.

As will be apparent to one skilled in the art, one reason why the amplifier according to the present invention preserves low-noise characteristics without compromising amplifier gain is because no active components are used to achieve those characteristics, other than the use of a passive capacitor and the amplifier itself.

In an alternative embodiment of an amplifier according to the present invention, the positive feedback capacitance can be supplied by another device, such as a transistor, that is configured so that it presents a capacitance between the amplifier outputs and inputs. For example, if the drain and source of a FET are shorted together and connected to one of the amplifier outputs, and the gate is tied to the amplifier input of the same polarity as the amplifier output, the FET will supply a capacitance between that amplifier output and input. As will be apparent to one skilled in the art, devices, such as NFETs and PFETs, can be used in the design of the amplifier.

In yet another embodiment of the amplifier according to the invention, a plurality of FET devices are configured to provide a selectable or programmable capacitance value between the amplifier outputs and the amplifier inputs. In this embodiment, the amount of positive feedback capacitance can be controlled, and thus, so can the amount of attenuation of the input signals to the amplifier due to the capacitive voltage dividing effect.

The amplifier of the present invention allows for a dramatic reduction in circuit size in comparison with that of an amplifier circuit in which a conventional approach is used for dc-blocking and high pass filtering (i.e., where the size of the filter is primarily determined by the resistor and capacitance as in $F_c = 1/2\pi RC$). For example, in one low-noise amplifier constructed in accordance with the present invention, a dc-blocking capacitance of only 50 pF was used on each of the differential amplifier inputs to obtain a 15 mHz corner frequency, $F_C$. When implemented in an integrated circuit, the die area taken up by this design is more than five times smaller than the die area consumed for a traditional implementation where the high pass corner frequency, $F_C$, was 10 Hz.

Other features and advantages of the present invention will become apparent from the following detailed description, taken in conjunction with the accompanying drawings, which illustrate by way of example, the features of the present invention.

DETAILED DESCRIPTION OF THE PREFERRED EMBODIMENTS

Persons skilled in the art will appreciate that the following description of the present invention is illustrative only and not in any way limiting. Other embodiments of the invention will readily be suggested to such skilled persons having the benefit of this disclosure.

Figure 1:
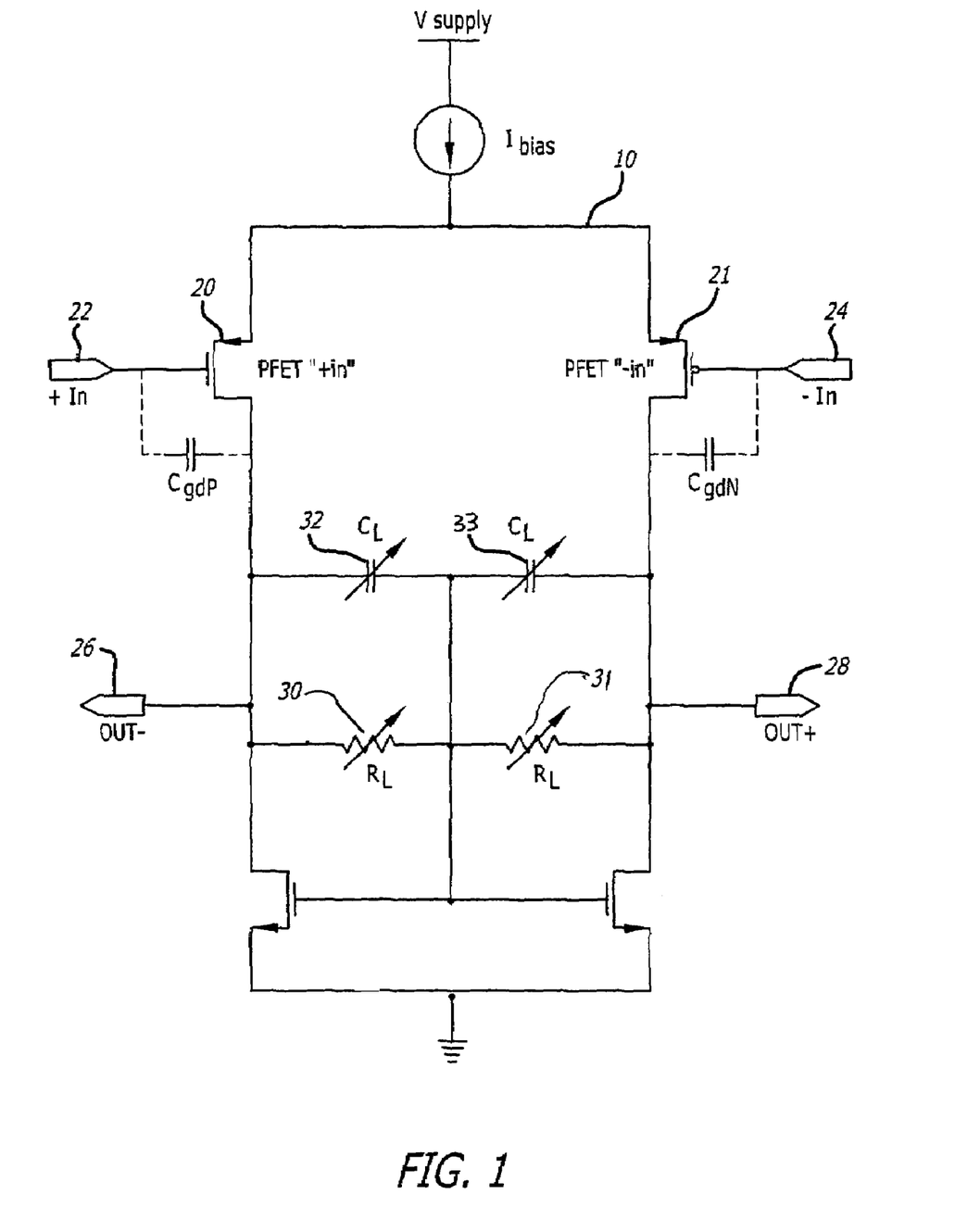
FIG. 1 is a schematic circuit diagram of a low-noise differential amplifier topology with PFETs at the amplifier inputs in accordance with one embodiment of the present invention.

Referring now to the drawings, wherein like reference numerals denote like or corresponding parts throughout the drawings, and more particularly, to FIG. 1, in a simplified schematic, a typical differential amplifier circuit used to implement a low-noise amplifier 10 in accordance with an embodiment of the invention is shown. The amplifier 10 has inputs "+in" 22 and "−in" 24 and outputs "−out" 26 and "+out" 28. Load resistors, $R_L$ 30 and 31 and capacitors, $C_L$ 32 and 33 determine the low-pass frequency response and gain of the amplifier.

Although not being limited to a particular type of FET, P-type metal oxide silicon field effect transistors, "PMOS-FETs" or simply "PFETs", are preferably used at the inputs "+in" 22 and "−in" 24 in part because of their lower contributions to "1/f" noise and the ability to bias the amplifier inputs at zero volts. Amplifier input PFET 20 is provided at the "+in" 22 input and amplifier input PFET 21 is provided at the "−in" 24 input.

As will be appreciated by one skilled in the art, the size and operational characteristics of the amplifier input PFETs 20 and 21 are selected based upon the design requirements for the particular application in which the amplifier 10 is to be used. These design requirements typically include the current or power budget for the application, the minimum noise levels or "noise floor," which includes the so-called "1/f noise" and thermal noise of the input PFETs and the desired tolerance in input offset voltage.

Figure 2:
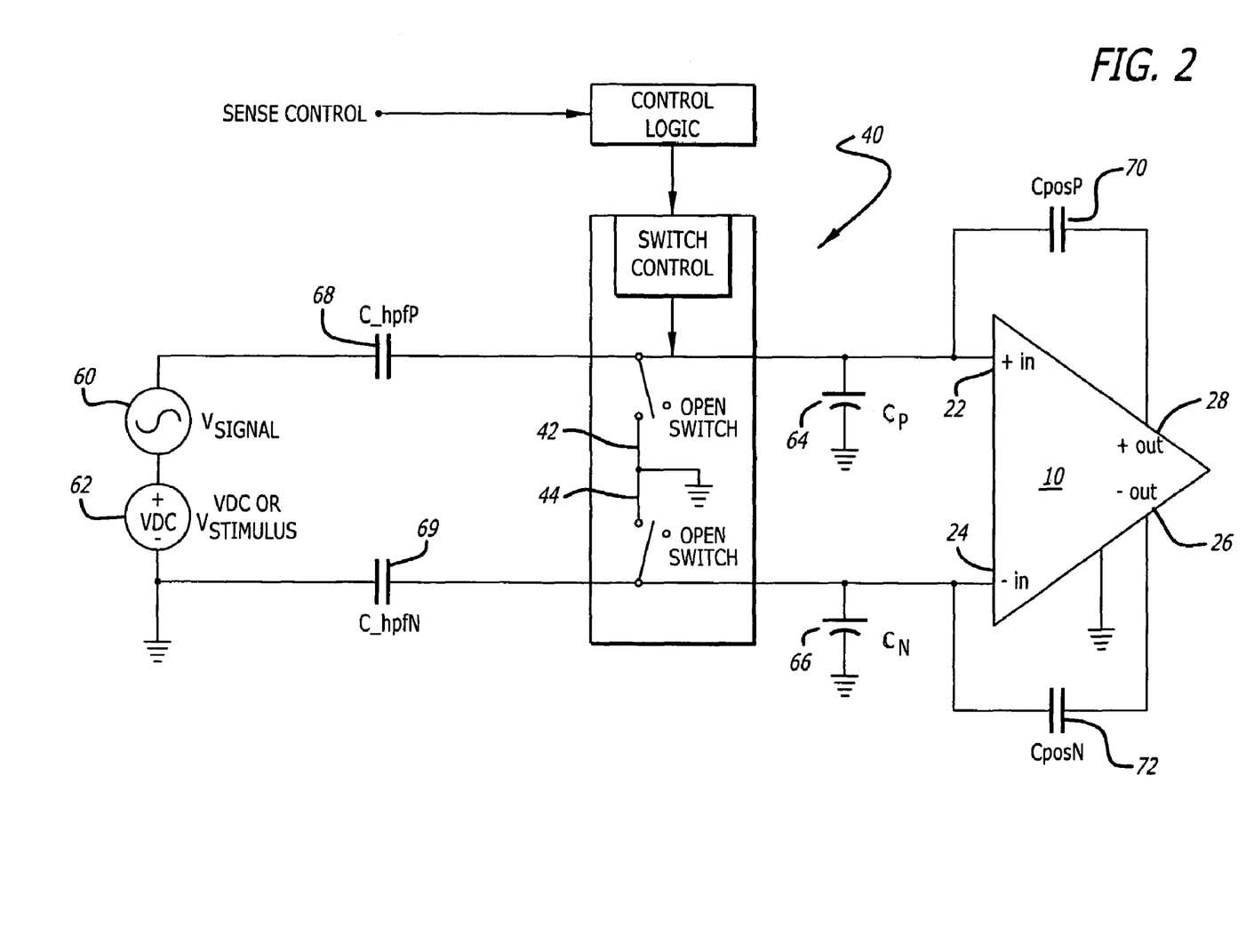
FIG. 2 is a schematic block diagram of a low-noise amplifier in accordance with one embodiment of the present invention illustrating dc-blocking capacitors in series with the Miller effect prone capacitances of the amplifier input transistors and positive feedback capacitors between the amplifier outputs and amplifier inputs.

Referring now to FIG. 2, a schematic block diagram for a LNA circuit 40 in accordance with an embodiment of the present invention is shown. The low-noise amplifier circuit 40 has an open loop gain, $A_o$ and the signal of interest is denoted by "$V_{signal}$" 60 and a dc-voltage used to represent a dc-offset or the stimulus voltage, is denoted by "VDC or $V_{stimulus}$" 62.

Because the amplifier input devices are PFETs, in operation the gates of the transistors will be negatively biased with respect to the transistor sources. A noiseless zero bias condition is established just before the amplifier 10 is called upon to amplify input signals. The switches 42 and 44 are closed which connects the amplifier 10 inputs "+in" 22 and "−in" 24 to signal ground. Any residual charge existing at the amplifier 10 inputs will be dissipated to signal ground. When an amplification operation commences, switches 42 and 44 are opened. In other words, when the switches 42 and 44 are opened, the amplifier input PFET gates will be at a zero value for the bias and starting conditions, and the input signal 60 will appear at the amplifier 10 inputs.

Figure 3:
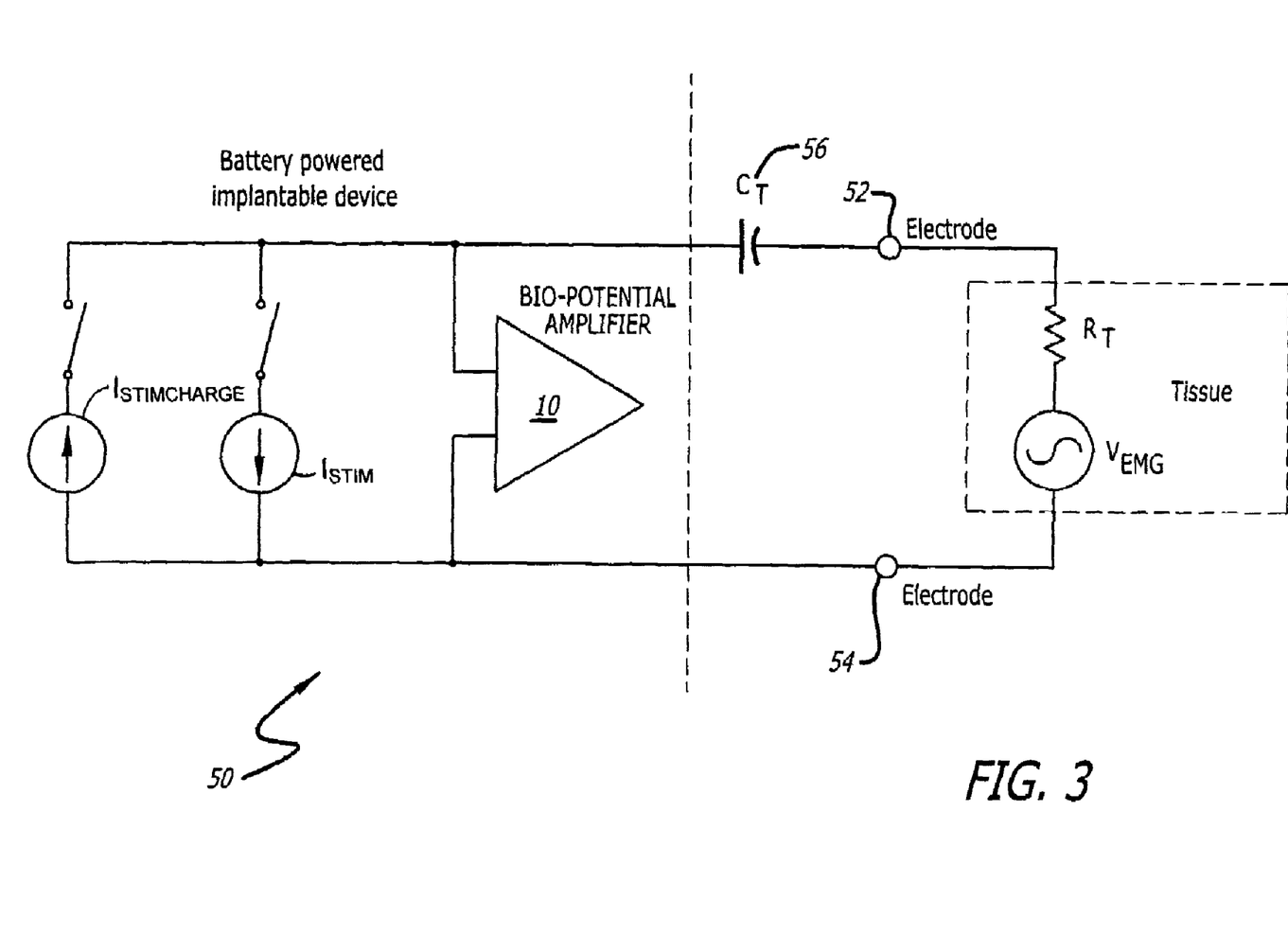
FIG. 3 is a schematic block diagram of a typical dc-blocked low-noise amplifier sensing circuit with electrodes that are used for both stimulation and sensing and an external stimulus capacitor that is required for the purposes of high voltage tissue stimulation.

Because of its low-noise characteristics, the amplifier 10 can be used with good results in applications 50 where the goal is to differentially amplify 10 low level signals with very low-frequency components. A block diagram of a typical application in which a differential amplifier is used to sense a biopotential is illustrated schematically in FIG. 3, where two electrodes 52 and 54 can be used both for sensing of biopotential signals and for stimulation of tissue. When a large stimulus voltage $I_{STIM}$ and a corresponding stimulus charge $I_{STIMCHARGE}$ is applied (e.g., on the order of 14 V), the large stimulus voltage will be present on an external stimulus capacitor, $C_T$ 56.

In applications such as described above in which the same electrodes are used for both stimulation and sensing, and referring again to FIG. 2, when the switches 42 and 44 are closed, any voltage spikes that might appear across the dc-blocking capacitors $C_{-hpfP}$ 68 and $C_{-hpfN}$ 69 will be shunted to ground and thus be prevented from passing through to amplifier inputs "+in" 22 and "−in" 24. Thus, when the low-noise amplifier circuit 40 of FIG. 2 is used in an implantable device, the circuit 40 will be floating when it is in a sensing operation. One of the two electrodes can be used as a reference or signal ground and therefore true differential sensing can be achieved by simply detecting the potential across the two electrodes.

Without any other compensation and by reason of the Miller Effect, the effective capacitance looking into amplifier inputs "+in" 22 or "−in" 24 will be the parasitic gate-to-drain capacitance, $C_{gdP}$ and $C_{gdN}$ of the amplifier input PFETS 20 and 21 respectively multiplied by the amplifier's open loop gain. That is, while the main contributions to parasitic capacitance in a PFET comes from the gate-to-source capacitance, $C_{gs}$, and the gate-to-drain capacitance, $C_{gd}$, because of the Miller Effect the value of the gate-to-drain capacitance, $C_{gd}$, at the amplifier input will appear to be larger by a factor corresponding to the open loop gain of the amplifier (i.e., $C_{gd}*A_o$). The larger the gate area of a PFET, the higher the value of the parasitic gata-to-drain capacitance, $C_{gd}$. Thus, some of the benefits to the design of using large area PFETs at the inputs of a low-noise amplifier (e.g., lower current density, lower "1/f" noise, lower input offset voltage), come at the expense of larger gate area and hence higher gate-to-drain capacitance $C_{gd}$ and therefore higher amplifier input capacitance.

The effective capacitance values of $C_P$ 64 and $C_N$ 66 looking into the amplifier inputs "+in" and "−in" respectively are essentially the gate to drain capacitance $C_{gd}$ multiplied by the open loop gain, $A_o$ of the amplifier 10, i.e. $C_P \sim C_{gd}*A_o$. In a sensing operation, each dc-blocking capacitor, $C_{-hpfP}$ 68 and $C_{-hpfN}$ 69 will be in series with the capacitors $C_P$ 64 and $C_N$ 66. This in turn creates a parasitic voltage divider between the sensed input signal and the amplifier's input terminals, as the sensed signal is now multiplied by the factor $C_{-hpf}/[C_{-hpf}+C_p]$, a value less then 1.0, at the amplifier inputs 22 and 24. More specifically, the sensed signal is now multiplied by the factor $C_{-hpf}/[C_{-hpf}+(C_{gd}*A_o)]$. For values of $C_{-hpfP}$ 68 and $C_{-hpfN}$ 69 that are desirably made small in order to conserve die area and values of $C_{gd}$ that become large due to larger area amplifier input PFETs 20 and 21 (in order to reduce "1/f" noise and input offset voltage, for example) this voltage divider effect can result in a relatively large attenuation of the input signal 60. It should be noted that although $C_P$ was used above, the equations are equally applicable for the use of $C_N$.

The magnitude of the voltage divider effect at each of the amplifier inputs "+in" 22 and "−in" 24 can be substantially reduced by introducing another capacitor that is used in positive feedback between each of the amplifier outputs "+out" 28 and "−out" 26 and the "+in" and "−in" respectively. This has the effect of reducing the input capacitance, $C_P$ 64 approximately to $A_o*(C_{gd}-C_{pos})$. The degree to which the signal 60 will be voltage divided may be controlled by selecting a particular value or values for the positive feedback capacitors $C_{posP}$ and $C_{posN}$ 70 and 72 respectively. The resulting voltage division of the sensed signal at the amplifier inputs with the use of this technique now becomes $C_{-hpf}/[C_{-hpf}+A_o*(C_{gd}-C_{pos})]$. It should be noted that $C_{pos}$ is used as a general notation and that it is intended to use in its place, either $C_{posP}$ or $C_{posN}$, as the case may be. Furthermore, $C_{pos}$ is limited to being less than or equal to $C_{gd}$.

Accordingly, it is observed from the above equation, when it is desired to minimize the voltage divider effect (i.e, come as close as possible to cancelling the voltage divider effect altogether), the capacitance value of the positive feedback capacitors $C_{posP}$ 70 and $C_{posN}$ 72 are selected to approximate the value of the parasitic capacitance of the respective amplifier input transistors, i.e., the gate-to-drain parasitic capacitance, $C_{gd}$ of amplifier input PFET 20 and the gate-to-drain parasitic capacitance, $C_{gd}$ of the amplifier input PFET 21. In such case, $(C_{gd}-C_{posP})$ approaches the value zero and $C_{-hpf}/C_{-hpf}$ equals one, resulting in essentially no voltage division or attenuation of the sensed signal at the amplifiers input terminals.

In such instances when it is desired to attenuate the amplifier input signals to some desired or pre-determined degree, then specific values for the positive feedback capacitances, $C_{posP}$ 70 and $C_{posN}$ 72 may be selected to give rise to the desired attenuation. In this regard, the LNA circuit 40 can be configured so that more than one value for the positive feedback capacitances, $C_{posP}$ 70 and $C_{posN}$ 72, can be selected so that the degree to which the amplifier input signals are attenuated can be controlled. In this manner, adjustment of the voltage divider effect at the amplifier inputs can be made programmable in the LNA circuit 40. Thus, the values specified for the positive feedback capacitances $C_{posP}$ 70 and $C_{posN}$ 72 may be selected as any predetermined percentage of the values specified for the gate-to-drain parasitic capacitances $C_{gd}$ where the predetermined percentage is chosen so as to produce the desired degree of signal attenuation.

By using the technique of providing the compensatory positive feedback in the manner described, the voltage divider effect can be controlled without adversely impacting the signal-to-noise ratio (SNR) of the LNA, since active components that might inject more noise into the circuit are not required in order to implement the technique.

Figure 4:
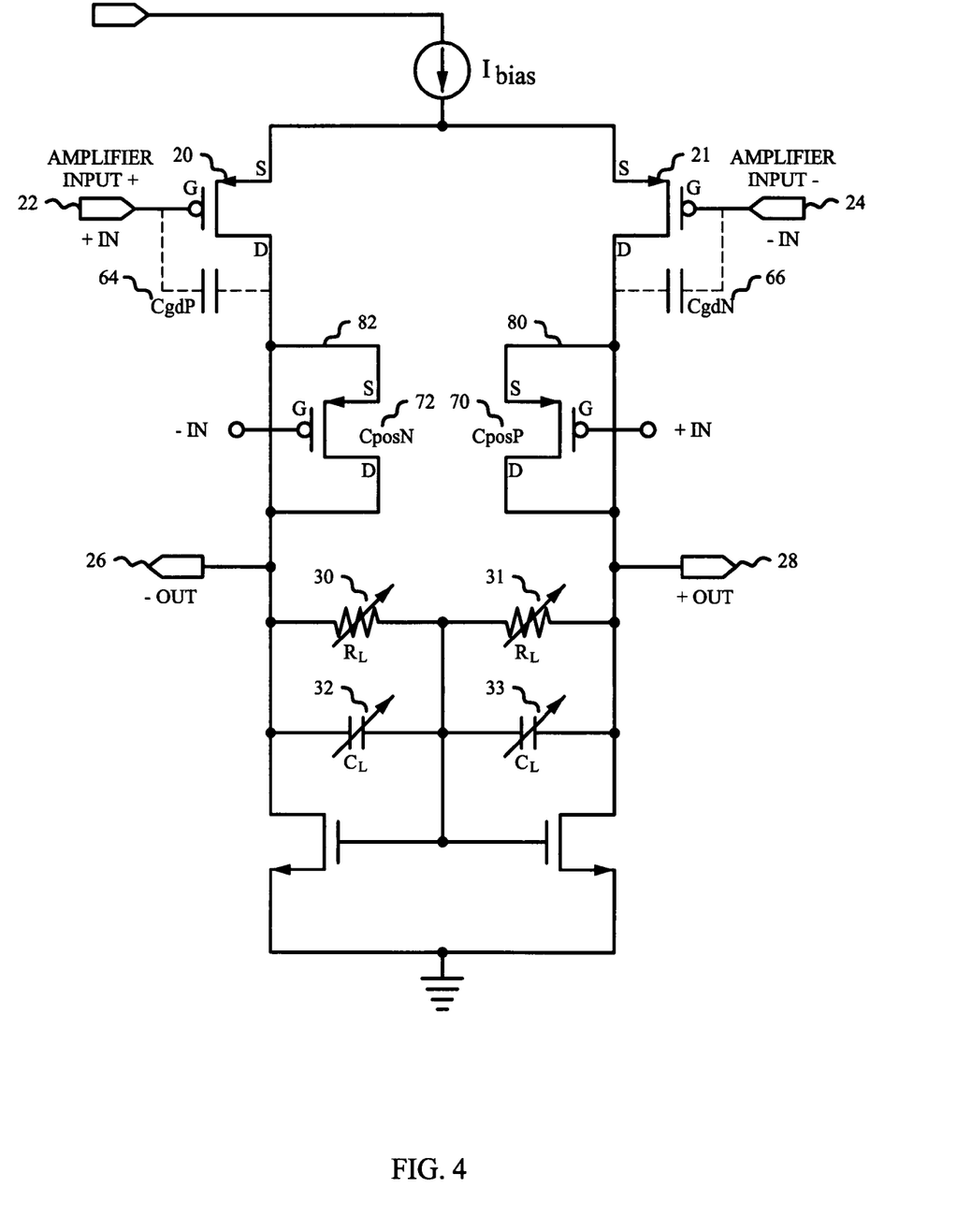
FIG. 4 is a schematic circuit diagram of a portion of a low-noise amplifier in accordance with an embodiment of the present invention in which PFET transistors are configured as the positive feedback capacitors shown in FIG. 2.

In an alternate embodiment of the amplifier 10 according to the invention, and with reference now to FIG. 4, the positive feedback capacitors $C_{posP}$ 70 and $C_{posN}$ 72 can be provided by PFETs 80 and 82. Again, where close to complete cancellation of the voltage divider effect is the objective, each positive feedback PFETs 80 and 82 is selected to have a characteristic parasitic gate-to-drain capacitance, $C_{gd}$, that is the same as, or as close as possible to, the parasitic gate-to-drain capacitance, $C_{gd}$ of the corresponding amplifier input PFET 20 or 21. Obviously, control of the voltage divider effect previously described may be controlled by causing the effective parasitic capacitance of positive feedback PFETs 80 and 82, to be a predetermined percentage of the effective parasitic capacitance of amplifier input PFETs 20 and 21, respectively.

The positive feedback PFETs 80 and 82 are configured as follows in order to provide capacitances between the amplifier outputs and inputs: The drain and source of each of the positive feedback PFETs 80 and 82 are shorted together. The gates of the positive feedback PFETs 80 and 82 are tied, respectively, to the amplifier inputs "+in" 22 and "−in" 24 of similar polarity (e.g., "+out" on the drain-source of the positive feedback PFET 80 is connected to "+input" on the gate of the amplifier input PFET 20). Thus, when the positive feedback PFETs 80 and 82 are configured in this fashion, the parasitic gate-to-drain capacitances, $C_{gd}$, of PFETs 80 and 82 will tend to cancel or otherwise modify the voltage divider effect at the amplifier inputs "+in" 22 and "−in" 24. As is the case where conventional capacitors are used for the positive feedback capacitors $C_{posP}$ 70 and $C_{posN}$ 72 described above, the Miller Effect will operate on both the positive feedback PFETs 80 and 82 and the parasitic gate-to-drain capacitances, $C_{gdP}$ 64 and $C_{gdN}$ 66, of PFETs 20 and 21. Accordingly, close to exact parasitic capacitance cancellation will occur, regardless of variations in the magnitude of the Miller Effect based on changes in amplifier open loop gain, $A_o$.

In order to minimize the die area occupied by the IC, especially in applications where the LNA is to be implemented in an implantable micro device or size restricted device, the die area occupied by the positive feedback PFETs 80 and 82 can be advantageously reduced by minimizing the length of the PFETs, since only the width of the gates of the PFETs will be of any measurable significance in determining what the effective value of the capacitance of positive feedback PFETs 80 and 82 will be. That is, the electrical shorting of the drain and source of each positive feedback PFET 80 and 82 makes the parasitic capacitance due to their gate lengths insignificant. As a result, the positive feedback PFETs 80 and 82 can be much smaller than the amplifier input PFETs 20 and 21 in terms of the gate area, but will still have the effect of significantly lowering the voltage divider effect due to the parasitic capacitance of the amplifier input PFETs 20 and 21. The degree to which the voltage divider action is reduced depends on the effective parasitic capacitance of 80 and 82, and this now will depend on gate widths of PFETs 80 and 82 in relation to the effective gate with of the amplifier input PFETs 20 and 21.

Figure 5:
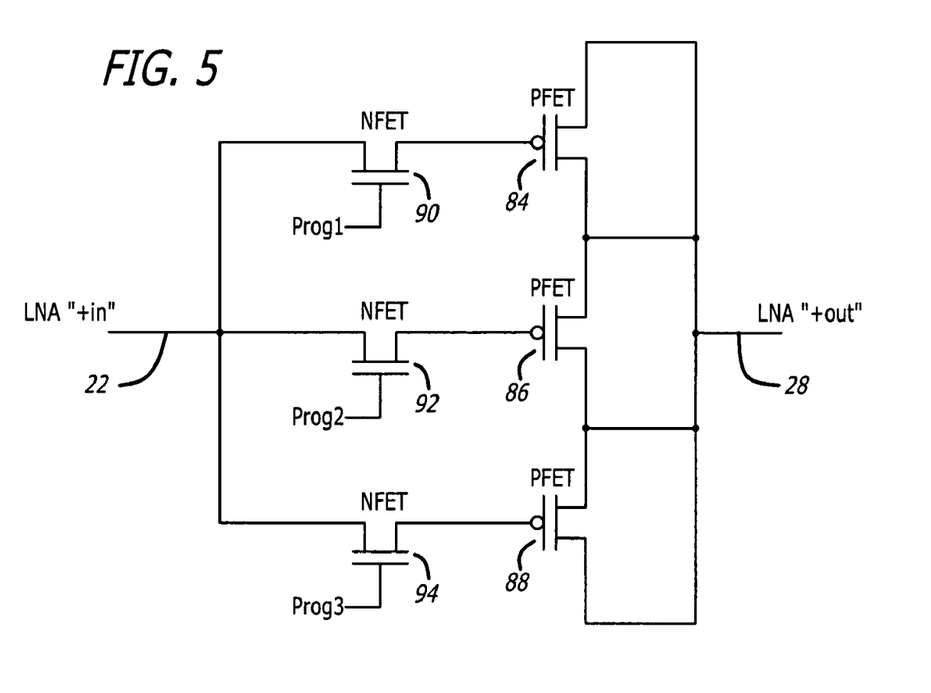
FIG. 5 is a schematic circuit diagram of a programmable positive feedback capacitance feature of an embodiment according to the present invention, for use between the positive amplifier output and the positive amplifier input.
Figure 6:
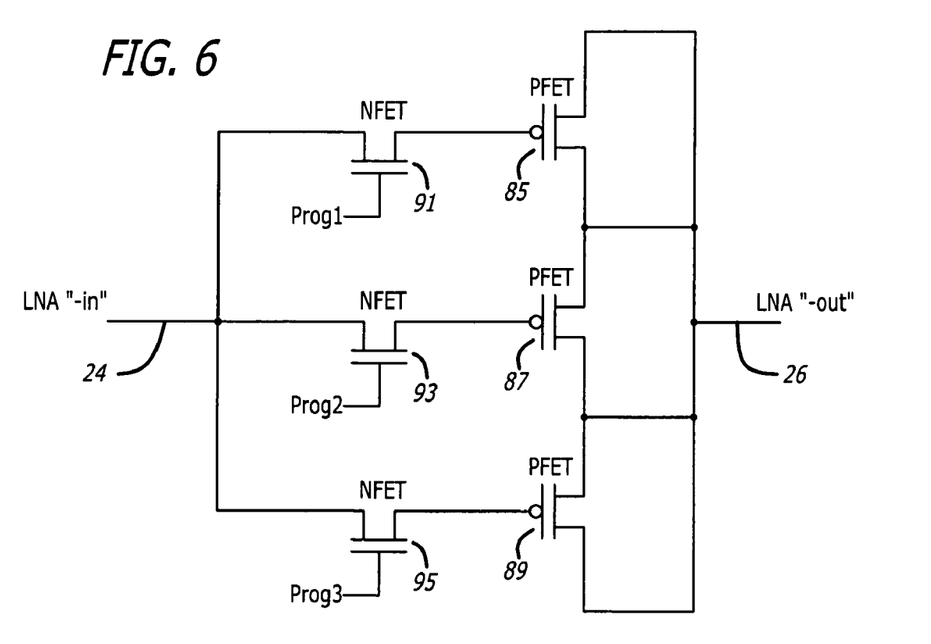
FIG. 6 is a schematic circuit diagram of a programmable positive feedback capacitance feature of an embodiment according to the present invention, for use between the negative amplifier output and the negative amplifier input.

In one embodiment of the invention, even greater latitude with respect to programming the degree of attenuation of the amplifier input signals can be achieved in a LNA circuit 40 by providing a plurality of different possible positive feedback capacitances, one or more of which can be selectively connected, using the appropriate selection circuitry, between each amplifier output and input to supply positive feedback capacitances $C_{posP}$ 70 and $C_{posN}$ 72. Referring now to FIGS. 5 and 6, one technique for providing a plurality of positive feedback capacitances between amplifier output "+out" 28 and amplifier input "+in" 22 (FIG. 5) and between amplifier output "−out" 26 and "−in" 24 (FIG. 6) is shown. More specifically, FIG. 5 illustrates a programmable positive feedback capacitance design in which three potential positive feedback PFETs 84, 86, and 88 are disposed in a parallel arrangement between amplifier output "+out" 28 and amplifier input "+in" 22, and FIG. 6 illustrates a similar configuration disposed between amplifier output "−out" 26 and amplifier input "−in" 24, having three potentially selectable positive feedback PFETs 85, 87, and 89. NFETs 90, 92, and 94 in FIG. 5 and NFETs 91, 93, and 95 in FIG. 6, respectively, are used to select a given one or more of positive feedback PFETs 84, 86, 88, 85, 87, or 89, respectively, so as to connect the desired PFET(s) between an amplifier output and the corresponding amplifier input. In this manner, the amount of capacitance provided in positive feedback to the amplifier inputs and, thus, the extent of adjustment of the voltage divider effect at the amplifier inputs resulting from the dc-blocking capacitors in series with the effective input capacitances of the amplifier, can be controlled to provide results in varying degrees of attenuation of the signals.

Care needs to be taken when the amplifier inputs "+in" 22 and "−in" 24 are zeroed, as the charge injection or clock feed through created by the switches involved can create large voltage offsets on the high impedance inputs. This can be alleviated by current slewed charging and gate control of the switches involved according to supplemental circuitry that would be apparent to one skilled in the art. Care also needs to be taken to ensure that the circuitry is masked from light as the high impedance inputs of the low-noise amplifier make it very sensitive to photoelectric current induced offsets.

In various embodiments of the invention, the open loop gain, $A_o$, beneficially can also be fairly well controlled, especially when the low-noise amplifier 10 operates in the subthreshold region where the transconductance $G_m$ is proportional to the bias current and the bias current and the load resistors, $R_L$ 30 and 31, values can track each other.

Temperature effects in various embodiments according to the invention can be mitigated by designing a PTAT (proportional to absolute temperature) current bias circuit to compensate for the CTAT (complementary to absolute temperature) behaviour of the low-noise amplifier's transconductance, $G_m$. Finally, in various embodiments according to the invention, an 80 dB input dynamic range can be achieved by appropriate gain degeneration set by programmable gains, the various possible methods of achievement of which will be apparent to one of skill in the art.

Accordingly, it will be appreciated that the invention provides a LNA with an ultra low-frequency high pass response that is ac-coupled or dc-blocked, wherein the dc-blocking capacitors are orders of magnitude smaller than when the LNA is implemented using conventional techniques. By predetermining the capacitance value of the positive feedback capacitors to be a certain percentage of the effective parasitic capacitance of the amplifier input transistors, the degree to which the input signals to the amplifier are attenuated can be programmed into the circuit. For example, if a positive feedback capacitor's capacitance value is predetermined to be 100% of, or approximately 100% of, the value of the effective parasitic capacitance of the amplifier input transistor with which it is associated, the positive feedback capacitor will tend to cancel any voltage divider action altogether that results from the in-series dc-blocking capacitors and the effective input capacitances of the amplifier 10. If the positive feedback capacitor's capacitance value is predetermined to be a different percentage of the value of the effective parasitic capacitance of the amplifier input transistor, the positive feedback capacitor will have a correspondingly different impact on the voltage dividing effect and on the resulting attenuation of the input signal.

As will be readily apparent to a person skilled in the art and having the benefit of this disclosure, there are a large number of possible ways of configuring a LNA according to the invention, for example, using different components for elements of the amplifier or varying numbers of components. All such possible ways are contemplated by the present invention, and may be used while staying within the inventive nature of the present disclosure.

Moreover, while the description herein generally is related to circumstances in which biopotentials are the signals of interest in an application in which both sensing and stimulation may be occurring, a low-noise amplifier according to the invention is by no means limited to such applications. There are numerous applications for the low-noise amplifier of the invention outside of the field of medical instrumentation or medical device, such as industrial applications, seismic and building vibration sensors, to name only a few examples. In addition, there are many more modifications than are mentioned above which are possible without departing from the inventive concepts contained herein. Thus, although the description above contains much specificity, the description should not be construed as limiting the scope of the invention; the descriptions given merely provide an illustration of the embodiments of the invention. The scope of the invention is determined by the appended claims and their legal equivalents.

What is claimed is:

1. A low-noise amplifier circuit, comprising:
   an amplifier having a positive input, a negative input, a positive output, a negative output, and an open-loop gain $A_o$;
   a first transistor providing a first parasitic capacitance at the positive input and a second transistor providing a second parasitic capacitance at the negative input;
   a third transistor coupled between the positive output and the positive input and providing thereby a first feedback capacitance comprising the parasitic capacitance of said third transistor;
   a fourth transistor coupled between the negative output and the negative input and providing thereby a second feedback capacitance comprising the parasitic capacitance of said fourth transistor, wherein the first feedback capacitance has a value that is a predetermined percentage of the first parasitic capacitance and the second feedback capacitance has a value that is a predetermined percentage of the second parasitic capacitance, and
   a first shorting switch coupled to the positive input and adapted to selectively short the positive input to ground and a second shorting switch coupled to the negative input and adapted to selectively short the negative input to ground, wherein when such switches short the respective inputs to ground, the amplifier's zero bias operating condition is established and wherein when such switches are open, no direct current path exists between the respective inputs and ground.

2. The circuit of claim 1 wherein
   the first parasitic capacitance multiplied by the open loop gain $A_o$ provides a first effective input capacitance; and
   the second parasitic capacitance multiplied by the open loop gain $A_o$ provides a second effective input capacitance.

3. The circuit of claim 1 wherein the first, second, third and fourth transistors are field effect transistors, said transistors having an equivalent gate area, wherein the source and drain of the third transistor are shorted together and the source and drain of the fourth transistor are shorted together and the equivalent area of the gate of the third transistor being sized to provide a parasitic capacitance of said third transistor of a predetermined value and the equivalent area of the gate of the fourth transistor being sized to provide a parasitic capacitance of said fourth transistor of a predetermined value.

4. The circuit of claim 3 wherein the area of the gate of the third transistor is sized to provide the parasitic capacitance of said third transistor substantially equal to the parasitic capacitance of the first transistor.

5. The circuit of claim 3 wherein the area of the gate of the fourth transistor is sized to provide the parasitic capacitance of said third transistor substantially equal to the parasitic capacitance of the second transistor.

6. The circuit of claim 1 wherein the first and second transistors and the third and fourth transistors are field effect transistors, said transistors having an equivalent gate area, wherein the source and drain of the third transistor are shorted together and the source and drain of the fourth transistor are shorted together and the equivalent area of the gate of the third transistor sized so as to provide a parasitic capacitance of said third transistor being a predetermined percentage of the parasitic capacitance of the first transistor and the equivalent area of the gate of the fourth transistor sized so as to provide a parasitic capacitance of said fourth transistor being a predetermined percentage of the parasitic capacitance of the second transistor.

7. A low-noise amplifier circuit, comprising:
   an amplifier having a positive input, a negative input, a positive output, a negative output, and an open-loop gain $A_o$;
   a first transistor providing a first parasitic capacitance at the positive input and a second transistor providing a second parasitic capacitance at the negative input;
   a third transistor coupled between the positive output and the positive input and providing thereby a first feedback capacitance comprising the parasitic capacitance of said third transistor;
   a fourth transistor coupled between the negative output and the negative input and providing thereby a second feedback capacitance comprising the parasitic capacitance of said fourth transistor, wherein the first feedback capacitance has a value that is a predetermined percentage of the first parasitic capacitance and the second feedback capacitance has a value that is a predetermined percentage of the second parasitic capacitance, and
   a first plurality of switchable feedback capacitors wherein each of the feedback capacitors in said first plurality being selectively switchable between the positive output and the positive input to thereby provide a corresponding plurality of first feedback capacitance values; and
   a second plurality of switchable feedback capacitors wherein each of the feedback capacitors in said second plurality being selectively switchable between the negative output and the negative input to thereby provide a corresponding plurality of second feedback capacitance values.

8. The circuit of claim 7 wherein each of the capacitors of the first plurality comprises the parasitic capacitance of a corresponding field effect transistor in a first plurality of field effect transistors and each of the capacitors of the second plurality comprises the parasitic capacitance of a corresponding field effect transistor in a second plurality of field effect transistors.

9. The circuit of claim 1 further comprising a first dc blocking capacitor in series circuit arrangement with the positive input and a second dc blocking capacitor in series circuit arrangement with the negative input.

10. The circuit of claim 1 further comprising a switch controller coupled to the first and second shorting switches said controller configured to cause the first and second shorting switches to short the respective positive and negative inputs to ground based upon a preselected criteria.

11. The circuit of claim 9 wherein the first dc blocking capacitor has a first side and a second side, the second side being in series circuit arrangement with the positive input, the first side coupled to a sensed signal-source providing a sensed signal, the signal appearing at the positive input being determined by the equation $$I_{n+}S_{ig} = SS \cdot [C_{\_hpf}/(C_{\_hpf} + A_o*(C_{gd} - C_{pos}))]$$

where $I_{n+}S_{ig}$ is the value of the signal at the positive input;
SS is the value of the sensed signal;
$C_{\_hpf}$ is the capacitance value of the first dc-blocking capacitor;
$A_o$ is the open loop gain of the amplifier;
$C_{gd}$ represents the value of the parasitic capacitance of the first transistor; and
$C_{pos}$ represents the value of the parasitic capacitance of the third transistor $C_{pos}$ being limited to be less than or equal to $C_{gd}$.

12. The circuit of claim 9 wherein the second dc-blocking capacitor has a first side and a second side, the second side being in series circuit arrangement with the negative input, the first side coupled to a sensed signal-source providing a sensed signal, the signal appearing at the negative input being determined by the equation $$I_{n-}S_{ig} = SS \cdot [C_{\_hpf}/(C_{\_hpf} + A_o*(C_{gd} - C_{pos}))]$$

where $I_{n-}S_{ig}$ is the value of the signal at the negative input;
SS is the value of the sensed signal;
$C_{\_hpf}$ is the capacitance value of the second dc-blocking capacitor;
$A_o$ is the open loop gain of the amplifier;
$C_{gd}$ represents the value of the parasitic capacitance of the second transistor; and
$C_{pos}$ represents the value of the parasitic capacitance of the fourth transistor $C_{pos}$ being limited to be less than or equal to $C_{gd}$.

13. A method for implementing a low-noise amplifier circuit comprising the steps of:
providing a first transistor operatively configured to provide a positive input stage for said amplifier and a second transistor operatively configured to provide a negative input stage for said amplifier;
providing components to set and control the open loop gain of the amplifier;
providing a first dc-blocking capacitor in series with the first transistor, the first dc-blocking capacitor selected to have a value that is at least as high as the value of a first effective input capacitance of the first transistor;
providing a second dc-blocking capacitor in series with the second transistor, the second dc-blocking capacitor selected to have a value that is at least as high as the value of a second effective input capacitance of the second transistor;
providing a first positive feedback capacitance between a positive amplifier output and the positive amplifier input, the first positive feedback capacitance value selected to be a percentage of 100 percent or less of the parasitic capacitance of the first transistor;
providing a second positive feedback capacitance between a negative amplifier output and the negative amplifier input, the second positive feedback capacitance value selected to be a percentage of 100 percent or less of the parasitic capacitance of the second transistor;
whereby the first and second positive feedback capacitances cause the cancellation or modification of a voltage dividing effect caused by the first and second dc-blocking capacitors being in series with the respective effective parasitic capacitances of the first and second transistors.

14. The method of claim 13 wherein the first effective input capacitance comprises the difference between
the parasitic capacitance of the first transistor and
the capacitance of the first positive feedback capacitance, said difference being multiplied by the open loop gain of the amplifier; and
wherein the second effective input capacitance comprises the difference between
the parasitic capacitance of the second transistor and
the capacitance of the second positive feedback capacitance, said difference being multiplied by the open loop gain of the amplifier.

15. A low-noise amplifier circuit, comprising:
an amplifier having a positive input, a negative input, a positive output, a negative output, and an open-loop gain $A_o$;
a first transistor providing a first parasitic capacitance at the positive input and a second transistor providing a second parasitic capacitance at the negative input;
a first feedback capacitor coupled between the positive output and the positive input;
a second feedback capacitor coupled between the negative output and the negative input, wherein the first feedback capacitor has a capacitance value that is a predetermined percentage of the first parasitic capacitance and the second feedback capacitor has a capacitance value that is a predetermined percentage of the second parasitic capacitance, and
a bias current source coupled to the amplifier and adapted to provide a bias current to at least the first and second transistors; and
components comprising at lease one resistor and at least one capacitor configured to set and control the open loop gain $A_o$ and frequency response of the amplifier.

* * * * *